United States Patent [19]

Jacquelin et al.

[11] Patent Number: 5,688,398

[45] Date of Patent: Nov. 18, 1997

[54] DEVICE FOR FILTERING AN ELECTRICALLY INSULATIVE AND THERMALLY CONDUCTIVE LIQUID MEDIUM AND A POWER ELECTRONICS UNIT INCORPORATING A DEVICE OF THIS KIND

[75] Inventors: Jean Jacquelin, Gorges les Bains; Claude Agnoux, Ollainville, both of France

[73] Assignee: GEC Alsthom Transport SA, Paris, France

[21] Appl. No.: 703,354

[22] Filed: Aug. 26, 1996

[30] Foreign Application Priority Data

Aug. 30, 1995 [FR] France ................... 95 10218

[51] Int. Cl.⁶ .................. B01D 35/027; B01D 35/28; H05K 7/20
[52] U.S. Cl. .................. 210/167; 210/180; 210/184; 210/186; 210/196; 210/243; 210/416.1; 210/460; 210/774; 165/80.4; 165/104.33; 361/677; 361/700; 257/715; 62/259.2
[58] Field of Search ..................... 210/167, 180, 210/181, 184, 185, 186, 196, 243, 416.1, 460, 774; 165/80.4, 104.33; 361/677, 700; 257/715; 62/259.2

[56] References Cited

U.S. PATENT DOCUMENTS

| | | |
|---|---|---|
| 2,886,746 | 5/1959 | Saby. |
| 2,917,685 | 12/1959 | Wiegand. |
| 3,626,080 | 12/1971 | Pierce. |
| 3,660,784 | 5/1972 | Scharfman. |
| 4,053,942 | 10/1977 | Dougherty. |
| 4,203,129 | 5/1980 | Oktay. |
| 4,619,316 | 10/1986 | Nakayama. |
| 4,653,579 | 3/1987 | Fujii. |
| 4,828,692 | 5/1989 | Peranio. |
| 4,957,624 | 9/1990 | Peranio. |
| 5,273,719 | 12/1993 | Kishi. |

FOREIGN PATENT DOCUMENTS

| | | |
|---|---|---|
| 1064730 | 5/1954 | France. |
| 2257615 | 5/1974 | Germany. |
| 61-131553 | 6/1986 | Japan. |

OTHER PUBLICATIONS

IBM Techical Disclosure Bulletin; Perfluorocarbon Coolant Reclamation Systems by R.R. Shields; vol. 18, No. 11, Apr. 1976 pp. 3664–3666.

IBM Technical Disclosure Bulletin; Thermal System for Immersed Electronics Cooled By Boiling; by Antonetti et al; vol. 14, No. 2, Jul. 1971, pp. 380–381.

P. H. Desai et al, "Evaluation of Freon Modules for Power Electronics Designed for a Locomotive Traction Drive", *IEEE Transactions On Industry Applications*, vol. 26, No. 3, May 1, 1990, pp. 394–400.

Primary Examiner—Thomas M. Lithgow
Attorney, Agent, or Firm—Sughrue,Mion,Zinn,Macpeak & Seas, PLLC

[57] ABSTRACT

A device for filtering an electrically insulative and thermally conductive medium includes at least one heater immersed in the liquid medium and at least one solid particle filter immersed in and permeable to the liquid medium. The immersed filter is located in a natural convection current of the liquid medium.

6 Claims, 6 Drawing Sheets

DEVICE FOR FILTERING AN ELECTRICALLY INSULATIVE AND THERMALLY CONDUCTIVE LIQUID MEDIUM AND A POWER ELECTRONICS UNIT INCORPORATING A DEVICE OF THIS KIND

BACKGROUND OF THE INVENTION

1. Field of the invention

The present invention concerns closed circuit methods of filtering electrically insulative and thermally conductive liquid media charged with solid particles contained in a power electronics unit tank, in general, and in particular a device for filtering an electrically insulative and thermally conductive liquid medium and a power electronics unit incorporating a device of this kind.

2. Description of the Prior Art

In many electrotechnical applications the equipment must be as compact as possible, either to facilitate its transportation or to occupy minimum space in the systems into which it is incorporated. This applies, for example, to the power electronics on high-speed trains.

Electrotechnical equipment includes various types of components and subsystems, including passive components and semiconductor components, and the aim is to install them as close together as possible in order to reduce the overall size of the equipment. In some cases the components must be close together to reduce the emission of electromagnetic interference, to facilitate shielding and thereby to minimize the interference generated.

On the other hand, various problems occur in the case of close association of electrical components at different voltages and which become heated in operation: apart from the purely mechanical problems and the problems of achieving a compact assembly, which are well known, there are two major types of problem.

The more compact the equipment, the more difficult it is to cool the components: the thermal energy to be evacuated is generated within a smaller space and heat transfer is impeded by the small passages between the components.

The electric field between parts at different potentials is inversely proportional to the distance between them. What is more, small dimensions often lead to smaller radius curves and therefore to local increases in the electric field.

All these factors tend to increase the risk of dielectric breakdown, i.e. of failure by electrical arcing.

A prior art solution to the problem of increasing the dielectric strength and thereby eliminating the risk of breakdown is to immerse the components in a bath of electrically insulative liquid. A solution of this kind is used in the case of high-tension transformers, for example, the windings of which are immersed in an oil bath.

The oil bath is cooled by closed-circuit circulation of the liquid through a heat exchanger by means of which heat is transferred to the exterior. This method of cooling is suitable for components that do not produce an excessive heat flow.

If the equipment includes components that require very substantial cooling, this solution is inadequate. Another well known solution in this case is to use "pool boiling". The components are immersed in an electrically insulative liquid which can boil due to the effect of the heat. The vapor that is produced separates from the liquid and is condensed in an upper peripheral area from which the heat is evacuated to the exterior. The condensed liquid is returned to the bath.

The pool boiling solution described above has two advantages:

Firstly, the cooling is highly effective and the distances between components do not need to be large.

Secondly, the dielectric strength of a liquid bath, even when boiling, is much better than that of air, enabling compact grouping of the components. The advantage of this is directly proportional to the operating voltage.

The pool boiling principle is implemented in many different variants, according to the shapes of the baths and the condensers. Also, the thermal design rules are well established.

The pool boiling solution has been adopted in some industrial applications.

High-speed trains are one example. They incorporate power electronics tanks with a limited available volume and a high installed power density.

The active and passive components in these tanks are immersed in a liquid, traditionally of the CFC type, currently being replaced by a substitute having substantially the same electrical insulation properties and thermal conductivity on boiling.

There is normally virtually no risk of electrical breakdown, because the live components are immersed in the liquid bath, with appropriate dimensions.

However, an electrical insulation fault is likely to lead to breakdown by electrical arcing as the result of a slow deterioration in the dielectric properties of the liquid. This aging is characterized by a slow increase in the concentration of particles in the liquid. These particles are the result of very slight mechanical, chemical and electrochemical damage to the surface of the various materials that are immersed in the insulative liquid bath. It is well known that the dielectric quality of an insulative liquid depends on the concentration of particles it contains. The problem of eliminating particles so that the remaining concentration is low is not a simple one and solving it may be complex and costly.

In the case of power components cooled by pool boiling, the reliability of which, in terms of electrical insulation, deteriorates progressively because particles are released as the equipment ages, one solution is to trap these particles.

In the case of power electronics tanks for high-speed traction applications, the conventional solutions of filtration with forced convection are impractical: the fluid circuits, pumps and filters are inconvenient, costly and less reliable.

Accordingly, one aim of the device of the invention for filtering an electrically insulative and thermally conductive liquid medium is to trap the particles in suspension in the liquid so that the particle concentration increases more slowly or is maintained constant, in order to increase the service life of the equipment and even to maintain constant the reliability of the electrical insulation.

Another aim of the method of the invention for filtering an insulative liquid medium is to provide a solution that is simple, low in cost, compact in overall size and very high in reliability, in order to avoid introducing any new risk of failure.

SUMMARY OF THE INVENTION

In accordance with the invention, the filter device comprises at least one heating means immersed in a liquid medium and at least one immersed means for filtering solid particles permeable to the liquid medium, the immersed filter means being located in the natural convection current of the liquid medium, the device being characterized in that it comprises an enclosure at least partially immersed in the liquid medium and containing the immersed heating means, the enclosure being at least partially constituted by the immersed means for filtering solid particles in the liquid medium and at least by an outlet orifice.

The filter device of the invention also has at least one of the following features:

the outlet orifice emerges from the liquid medium, the outlet orifice is immersed in the liquid medium, the outlet orifice is closed by means for filtering solid particles permeable to the liquid medium or the gas.

In accordance with the invention, the power electronics assembly comprises a sealed tank within which are disposed power electronic components immersed in an electrically insulative and thermally conductive liquid medium, wherein it comprises at least one filter device disposed inside the tank to capture at least some of the unwanted solid particles contained in the liquid medium.

In accordance with a subsidiary feature of the power electronics assembly, the heating means comprise one or more power electronic components of the assembly.

One advantage of the device of the invention for filtering an electrically insulative and thermally conductive liquid medium is that it does not use any electromechanical accessory device such as a motor or a Another advantage of the device of the invention for filtering an electrically insulative and thermally conductive liquid medium is that it has no rotating members and has only a minimal number of static components, the reliability of which is guaranteed and the cost of which is extremely marginal.

In other words, with many configurations being possible, in situ filtration by two-phase natural convection constitutes a solution that is simple, low in cost and well suited to the configuration of the tanks.

Another advantage of the device of the invention for filtering an electrically insulative and thermally conductive liquid medium is that the two essential components can be components already present in the bath.

Other objects, features and advantages of the invention will emerge from a reading of the description of the method of and the device for filtering an electrically insulative and thermally conductive liquid medium given with reference to the drawings.

DETAILED DESCRIPTION OF THE PREFERRED EMBODIMENTS

Figure 1:
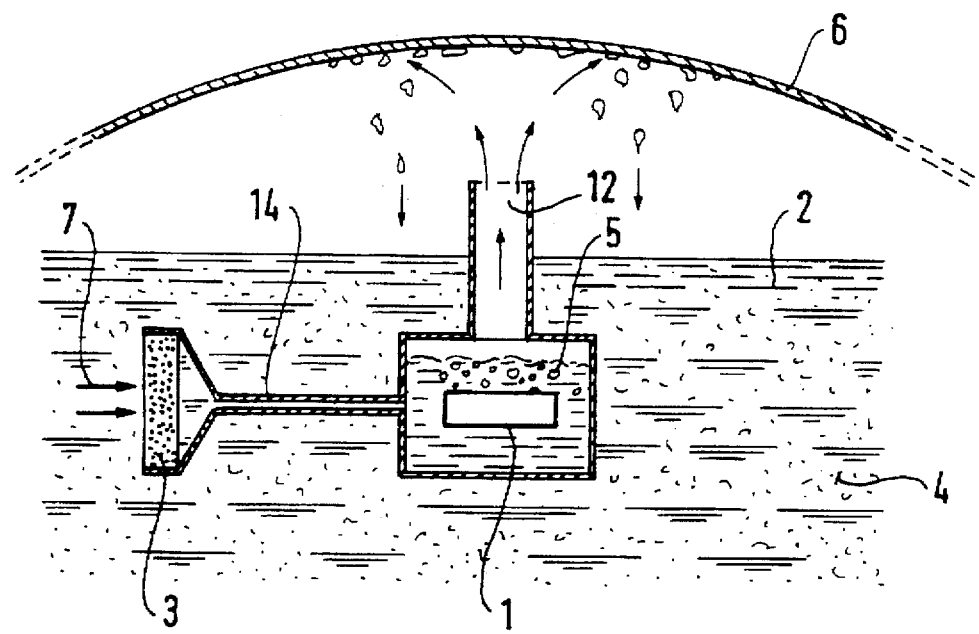
FIG. 1 shows the principle of the method of the invention of filtering an electrically insulative and thermally conductive liquid medium.

FIG. 1 shows a first embodiment of the device for filtering an electrically insulative and thermally conductive liquid medium showing the principle of the method of the invention of filtering an electrically insulative and thermally conductive liquid medium.

The device of the invention for filtering an electrically insulative and thermally conductive liquid medium includes means 1 for heating the liquid medium 2 and means 3 for filtering solid particles 4 contained in the liquid medium.

The combination of the heating means 1 and the filter means 3 is immersed in the liquid medium, which is contained in a tank 6.

The function of the heating means 1 is to boil the liquid with which it is in contact.

The heating means comprise, for example, a simple resistive heater element the power rating of which is very small compared to that of the equipment to be made more reliable.

The function of the means for filtering solid particles in the liquid medium is to retain the particles.

The means for filtering solid particles in the liquid medium comprise one or more of the following, for example: chicane, grid, cellular or porous material, filter material.

The means for filtering solid particles in the liquid medium are preferably of very small size.

The relative positions of the heating means and the means for filtering solid particles in the liquid medium are such that:

The boiling liquid medium is converted to a gas 5. This gas expands spontaneously into the upper part of the tank 6 where it mixes with the much greater quantity of the same gas that is present in ordinary operation of the equipment. It condenses and returns to the bath without requiring any means additional to those already present for the ordinary operation of the equipment.

The boiling liquid around the heater element therefore disappears progressively as it is converted to the gaseous state. It is replaced by a part 7 of the liquid by the simple process of natural convection.

The liquid arriving by natural convection is drawn from the bath through one or more pipes 14 and passes through the means for filtering the solid particles.

In the method and device of the invention for filtering an electrically insulative and thermally conductive liquid medium, a certain flow of liquid from the bath containing a given concentration of particles passes through the filter means which retain the solid particle.

This flow of liquid is converted into gas by the heating means. The gas condenses above the bath and the resulting liquid returns to the bath free of solid particles.

It is sufficient for the dimensions of the heating means producing this flow of liquid to be such that the quantity of particles trapped in a given operating time is at least equal to the quantity of new particles generated by aging during the corresponding time.

As the quantity of particles generated is small, even considering the total service life of the equipment, the dimensions of the means for filtering solid particles can be small, even if a large safety margin is allowed.

There is of course no limit on the relative disposition of the heating means and the means for filtering solid particles, each of which can have a multitude of shapes and which can be interconnected in a multitude of ways.

FIGS. 2 through 12 show various embodiments of a filter device for implementing the method of the invention of filtering an electrically insulative and thermally conductive liquid medium.

In the description of FIGS. 2 through 12 the expression "tube" is to be understood as meaning any enclosure or any means within which or near which the electrically insulative and thermally conductive liquid medium boils.

Figure 2:
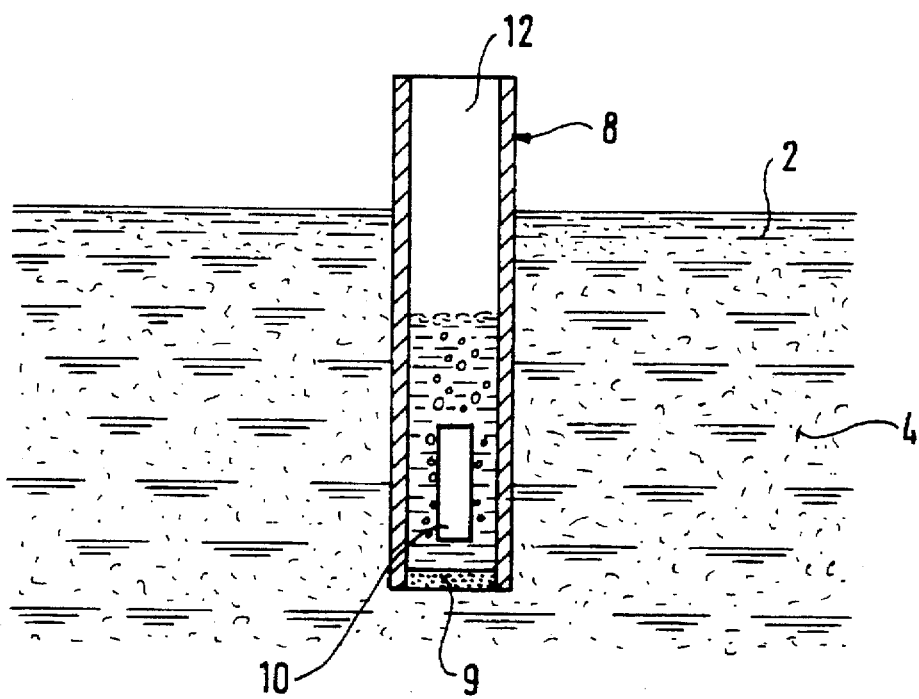
FIGS. 2 through 12 show various embodiments of filter devices for implementing the method of the invention of filtering an electrically insulative and thermally conductive liquid medium.

FIG. 2 shows a configuration in which the means for filtering solid particles are placed in a vertical tube 8.

The top of the tube includes a gas outlet orifice 12.

The bottom of the tube is made from a porous material 9 and constitutes the means for filtering solid particles.

The heating means comprise a resistive heater element 10 disposed in the tube.

Figure 3:
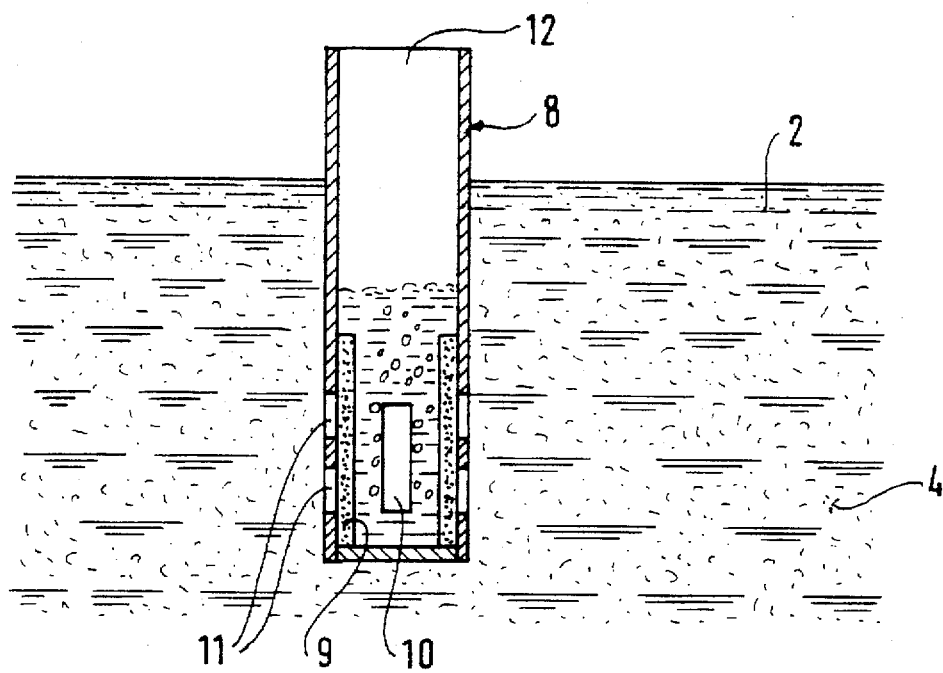

FIG. 3 shows a configuration in which the means for filtering solid particles are placed in a vertical tube 8 having laterally disposed liquid entry orifices 11.

The top of the tube includes a gas outlet orifice 12.

The means 4 for filtering solid particles comprise a porous material 9 lining part of or all of the interior of the perforated tube, facing the inlet orifices.

A resistive heater element 10 is disposed in the tube.

Figure 4:
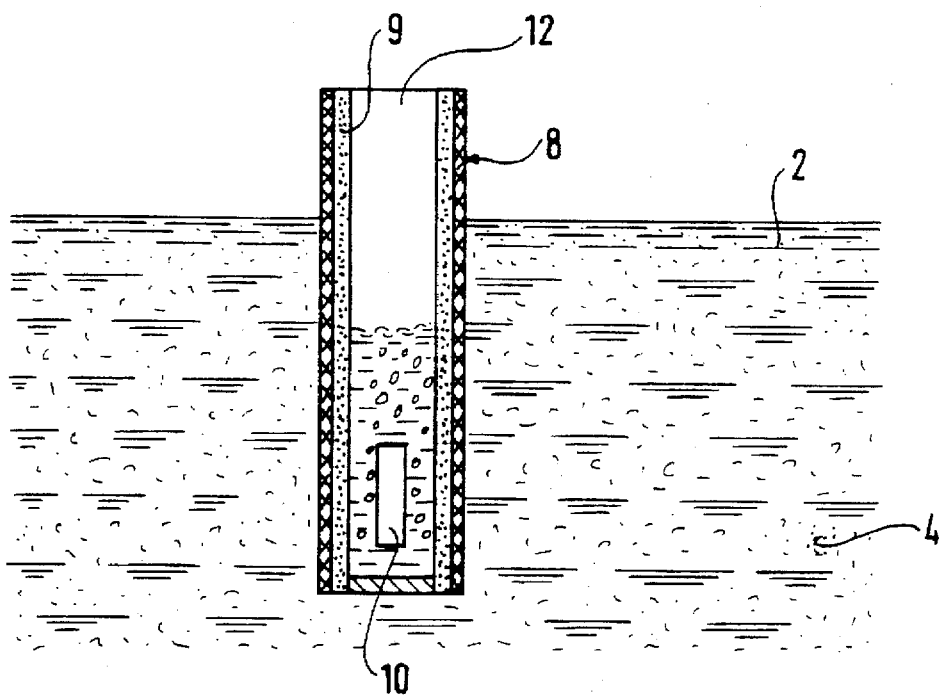

FIG. 4 shows a configuration in which the means for filtering solid particles are placed in a vertical tube 8 in the form of a grid.

The top of the tube includes a gas outlet orifice 12.

The interior of the tube is lined with a porous material 9 constituting the means for filtering solid particles.

A resistive heater element 10 is disposed in the tube.

Figure 5:
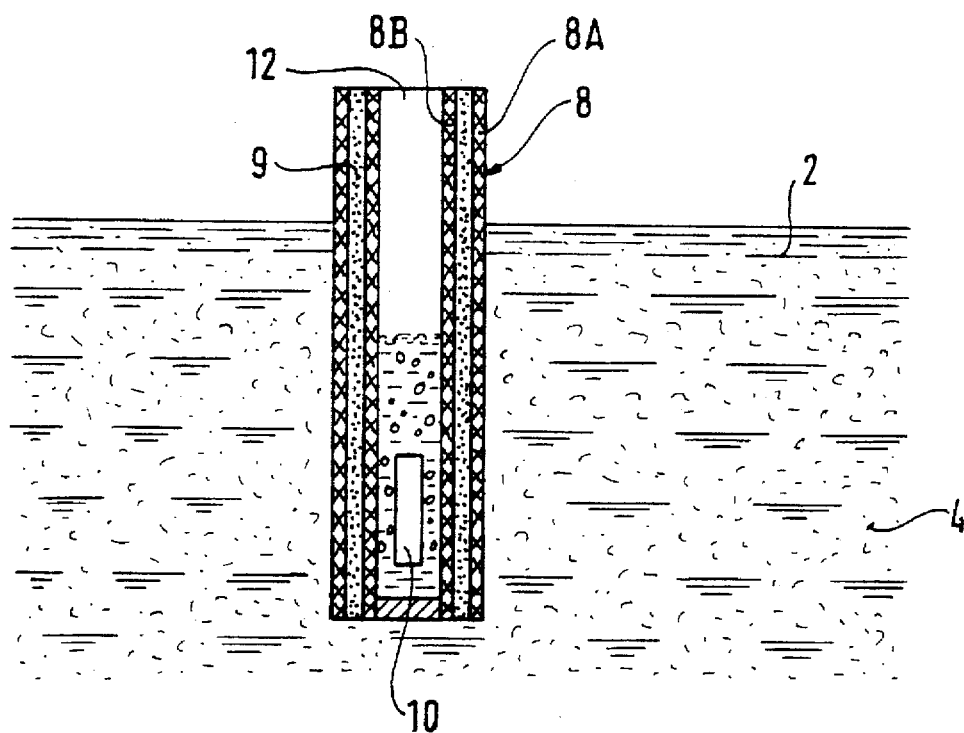

FIG. 5 shows a configuration in which the means for filtering solid particles are placed in a vertical tube 8 in the form of a grid with two layers 8A, 8B.

The top of the tube includes a gas outlet orifice 12.

The means 4 for filtering solid particles comprise a porous material 9 disposed between the two layers of grid.

A resistive heater element 10 is disposed in the tube.

Figure 6:
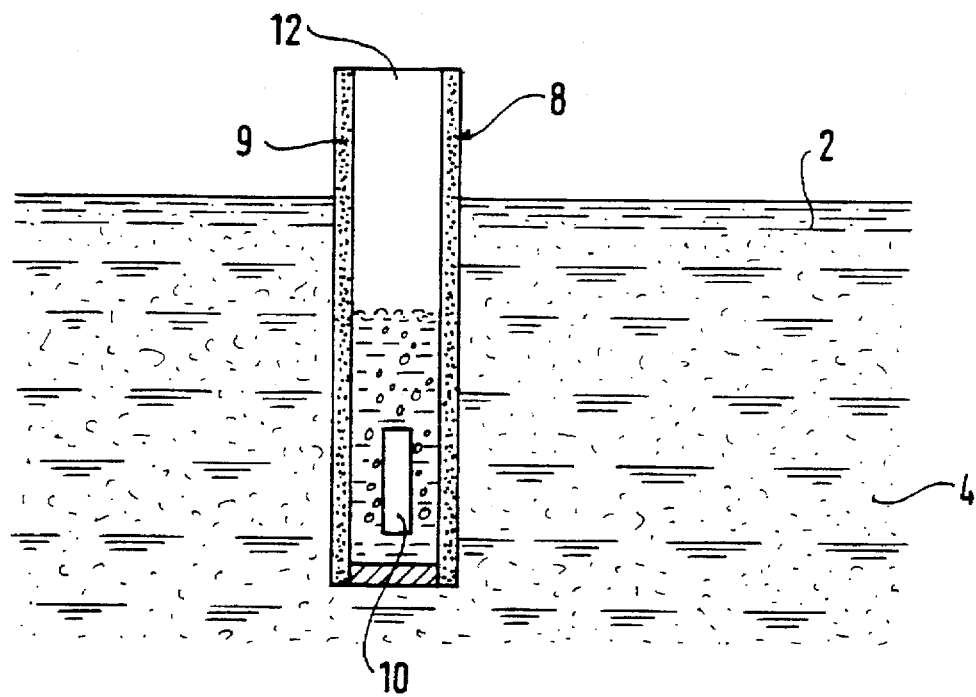

FIG. 6 shows a configuration in which the means 4 for filtering solid particles comprise a vertical tube 8 made from a porous material 9 containing a resistive heater element 10.

Figure 7:
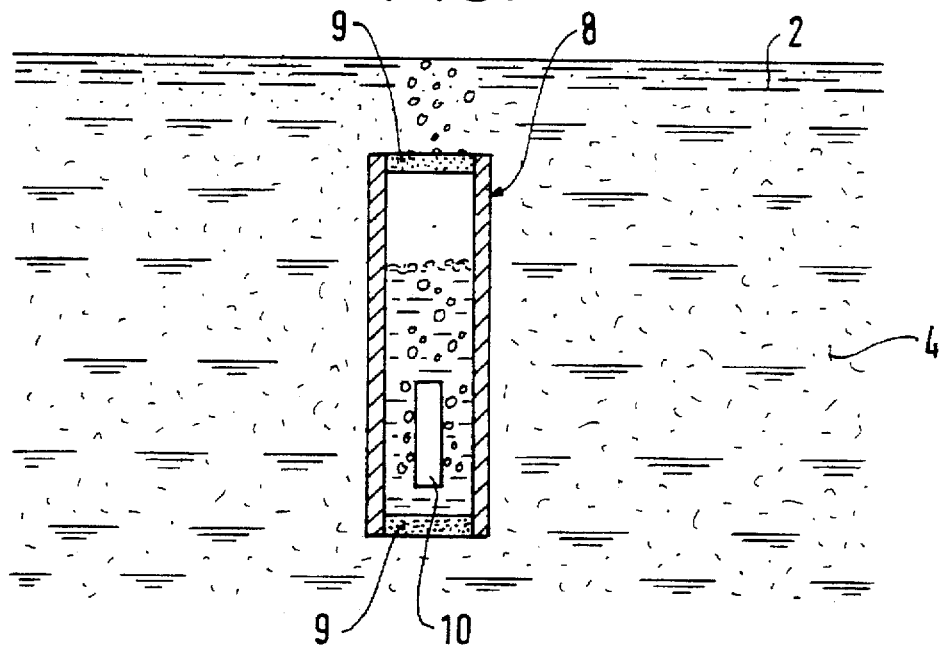

FIG. 7 shows a configuration similar to that of FIG. 2, apart from two differences: firstly, the filter device is totally immersed; secondly, the means for filtering solid particles comprise a porous material 9 at the top and at the bottom of the tube 8.

In an embodiment of this kind the gas produced exits via the porous material 9 at the top of the tube.

All of the embodiments shown in FIGS. 2 through 6 can also be totally immersed.

Figure 8:
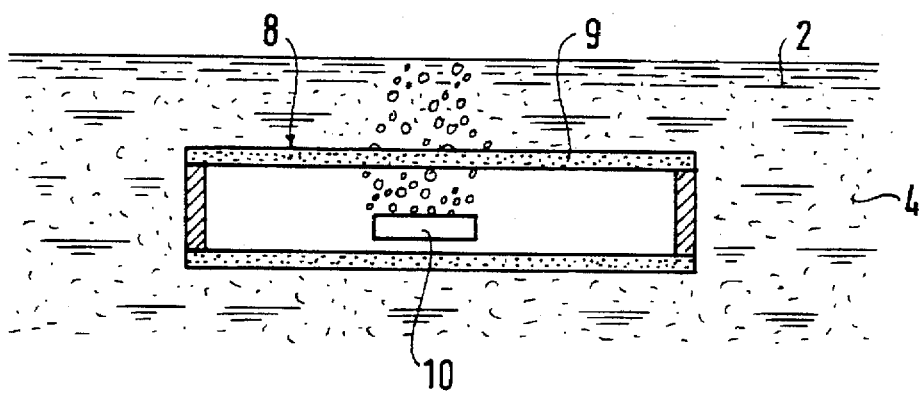

FIG. 8 shows a totally immersed horizontal filter device. The resistive heater element 10 is surrounded by a porous material tube 9. The porous material filters the liquid entering through the bottom or through the side of the tube and the gas exits through the top of the tube.

This embodiment can be implemented in diverse variants, namely: entirely porous tube, perforated tube with porous lining, tube comprising at least one layer of grid.

Figure 9:
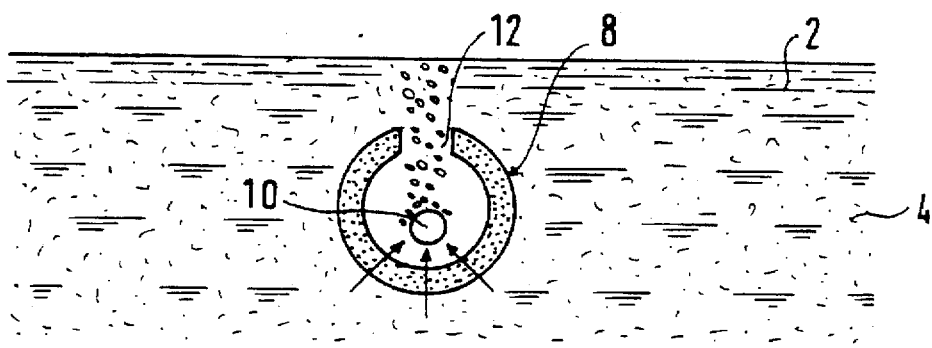
Figure 10:
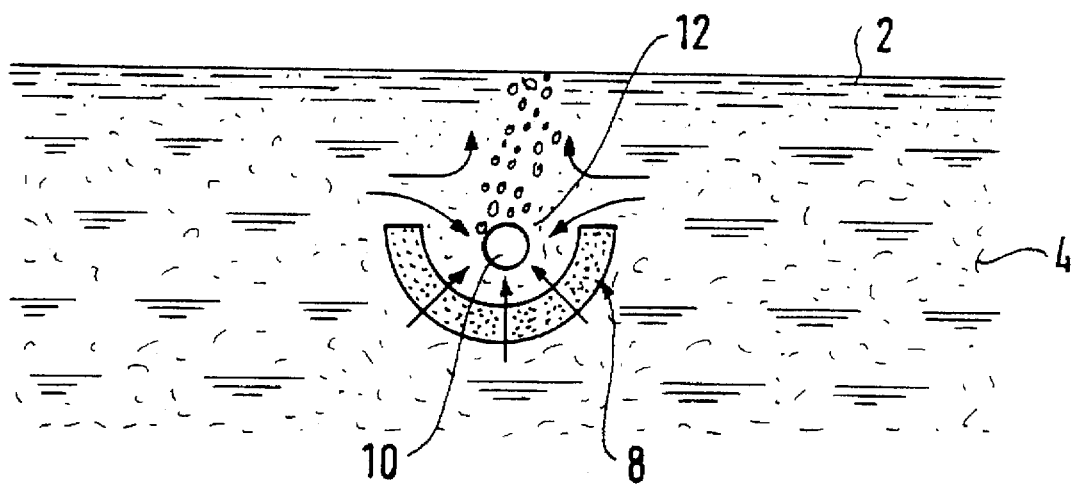

FIGS. 9 and 10 show horizontal embodiments in which the tube 8 does not entirely surround the resistive heater element 10.

The upper part of the means for filtering solid particles disposed above the heating means includes an outlet orifice 12.

In these embodiments, not all of the flow of liquid passes through the means for filtering solid particles. A greater heating power is therefore required for the part of the flow of liquid that is filtered to continue to be sufficient. The heating power required is directly proportional to the size of the direct passage for the liquid relative to the size of the passage through the filter means.

Figure 11:
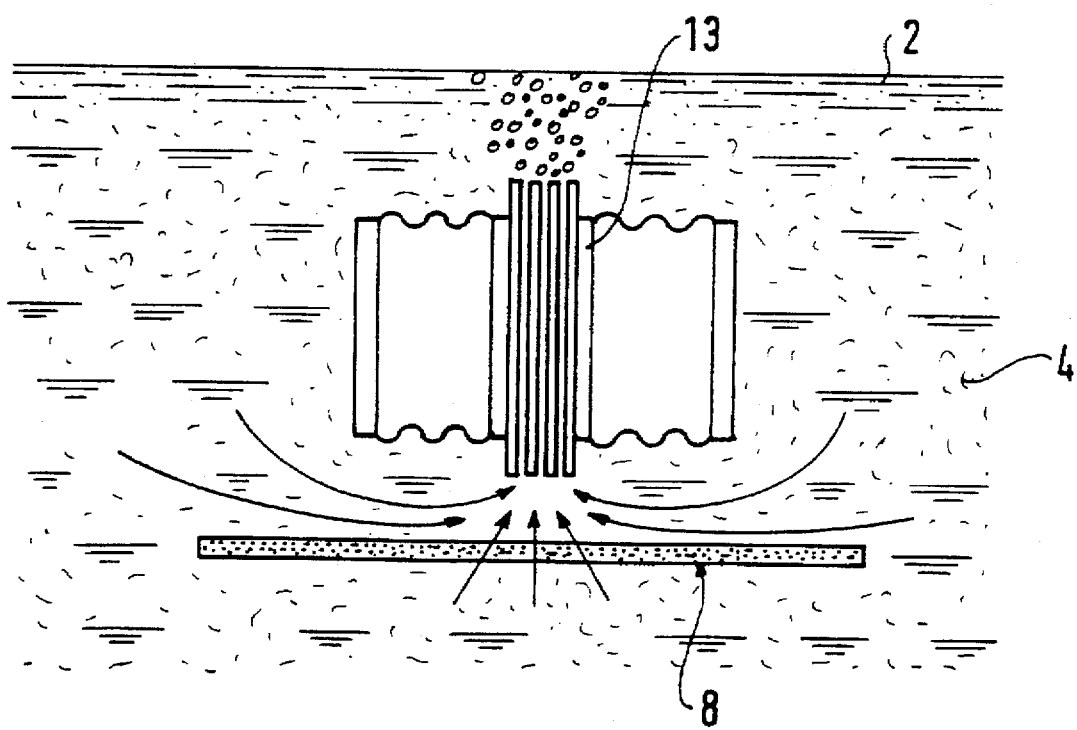

FIG. 11 is similar to FIGS. 9 and 10. The direct passage is larger than the passage shown in FIGS. 9 and 10.

As a result, in this embodiment the heating power must be 10 to 100 times greater than in the previous embodiments. It is then preferable to use, instead of a resistive heater element, one or more of the components 13 already immersed in the bath, which must be cooled in any event, and which evaporate a considerable flow of liquid.

This very simple embodiment therefore consists in placing at least one means for filtering solid particles under the existing power components in the bath. These means comprise one or more layers of material: chicanes, grids, porous materials. The intense flux caused by the existing components due to boiling of this flow of liquid in natural convection passes for the most part around the means for filtering solid particles. An embodiment of this kind is nevertheless sufficient to cause a proportionately small but nevertheless sufficient flow through the means for filtering solid particles.

Figure 12:
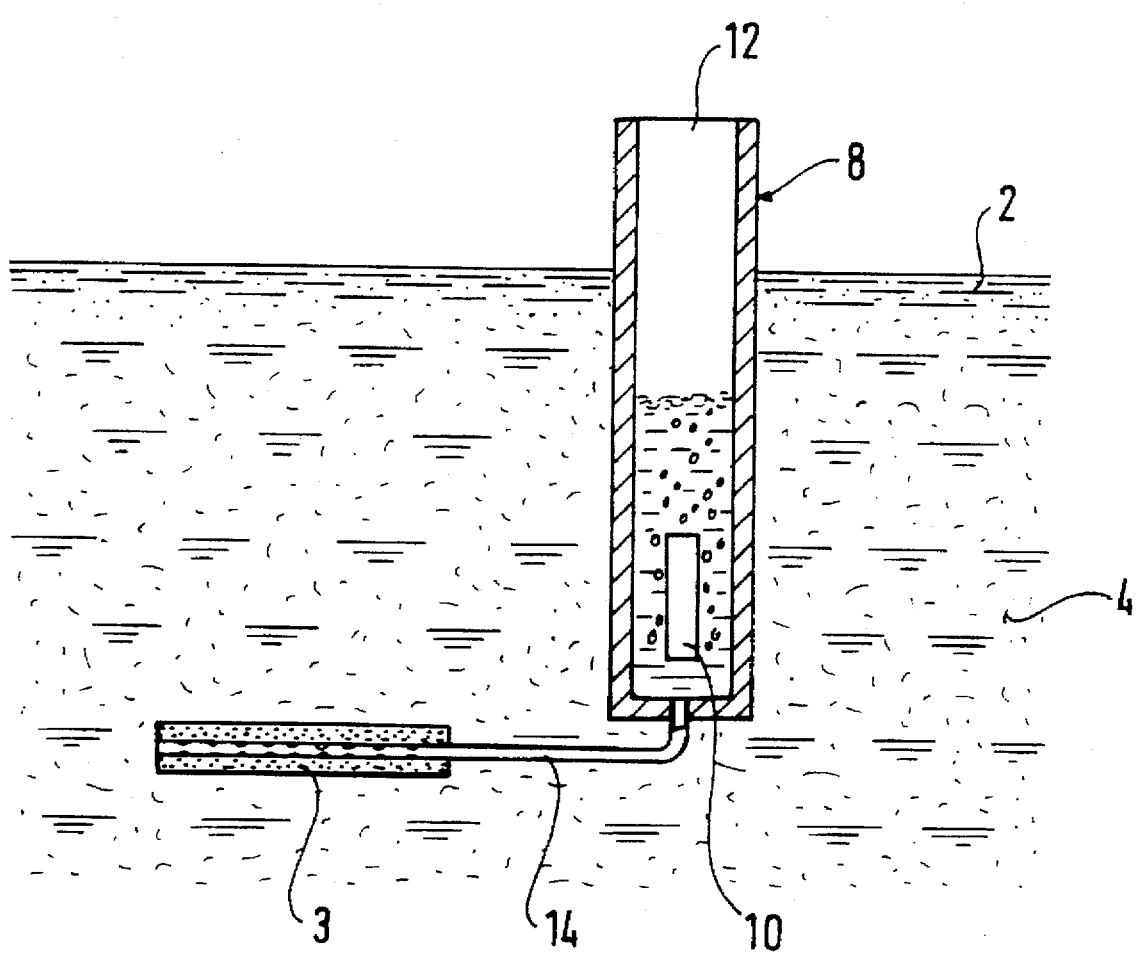

FIG. 12 shows another arrangement similar to the embodiment shown in FIG. 2.

The means 3 for filtering solid particles 4 are disposed at a distance from the tube 8 containing the heating means 10. The means for filtering solid particles and the heating means are connected by at least one pipe 14.

Tables 1 and 2 below give one example of the main dimensions of the filter devices shown in FIGS. 2 and 11, respectively.

TABLE 1

| | |
|---|---|
| tube diameter | 20 mm |
| tube height | 100 mm |
| filter diameter | 20 mm |
| filter thickness | 2 mm |
| nominal type | 5 micron |
| heater diameter | 6 mm |
| heater height | 20 mm |
| heater power | 20 w |
| theoretical liquid flowrate | 450 cm3/h |
| minimum sufficient flowrate | 150 cm3/h |

TABLE 2

| | |
|---|---|
| Existing component: GTO generating 1000 W of heat | |
| Distance between component and filter means | 5 mm |
| Composition of the filter: one porous layer between two grids | |
| surface area | 100 cm2 |
| thickness | 1 mm |
| total flowrate of liquid | 22 dm3/h |
| usable partial flowrate | 0.5 dm3/h |
| minimum sufficient flowrate | 0.15 dm3/h |

There is claimed:

1. A filter device comprising heating means immersed in a liquid medium, immersed means for filtering solid particles permeable to said liquid medium, said immersed filter means being located in a natural convection current of said liquid medium, and an enclosure at least partially immersed in said liquid medium and containing said immersed heating means, said enclosure being at least partially constituted by said immersed means for filtering solid particles in the liquid medium and by an outlet orifice.

2. The device claimed in claim 1 wherein said outlet orifice emerges from said liquid medium.

3. The device claimed in claim 1 wherein said outlet orifice is immersed in said liquid medium.

4. The device claimed in claim 2 wherein said outlet orifice is closed by means for filtering solid particles permeable to said liquid medium or said gas.

5. Power electronics unit comprising a sealed tank within which are disposed power electronic components immersed in an electrically insulative and thermally conductive liquid medium and at least one filter device as claimed in claim 1 disposed inside said tank to capture at least some of the unwanted solid particles contained in said liquid medium.

6. The unit claimed in claim 5 wherein said heating means comprise one or more power electronic components of said unit.

* * * * *